United States Patent
Chung et al.

(10) Patent No.: US 10,903,060 B2
(45) Date of Patent: Jan. 26, 2021

(54) METHOD FOR MASS SPECTROMETRIC EXAMINATION OF GAS MIXTURES AND MASS SPECTROMETER THEREFOR

(71) Applicant: Leybold GmbH, Cologne (DE)

(72) Inventors: Hin Yiu Anthony Chung, Ulm (DE);
Michel Aliman, Oberkochen (DE);
Gennady Fedosenko, Aalen (DE);
Albrecht Ranck, Aalen (DE)

(73) Assignee: Leybold GmbH, Cologne (DE)

( * ) Notice: Subject to any disclaimer, the term of this patent is extended or adjusted under 35 U.S.C. 154(b) by 437 days.

(21) Appl. No.: 15/244,720

(22) Filed: Aug. 23, 2016

(65) Prior Publication Data

US 2016/0372310 A1    Dec. 22, 2016

Related U.S. Application Data (60) Division of application No. 14/658,577, filed on Mar. 16, 2015, now abandoned, which is a continuation of
(Continued)

(30) Foreign Application Priority Data

Jan. 30, 2013    (DE) ........................ 10 2013 201 499

(51) Int. Cl.
    *H01J 49/00*      (2006.01)
    *H01J 49/10*      (2006.01)
(Continued)

(52) U.S. Cl.
    CPC ...... *H01J 49/0031* (2013.01); *C23C 16/4405* (2013.01); *C23C 16/52* (2013.01);
(Continued)

(58) Field of Classification Search
    CPC .. H01J 49/14; H01J 49/0031; H01J 2237/335; H01J 37/32862; H01J 49/009;
(Continued)

(56) References Cited

U.S. PATENT DOCUMENTS 4,144,451 A    3/1979   Kambara
5,381,006 A *   1/1995   Wells .................... H01J 49/005
                                                                                                                                                                                   250/282
(Continued)

FOREIGN PATENT DOCUMENTS

DE     10 2008 041 592      3/2010
EP        2 363 877 A1      9/2011
(Continued)

OTHER PUBLICATIONS

"Ambiguous"—Merriam-Webster, Mar. 28, 2019, retrieved from https://www.merriam-webster.com/dictionary/ambiguous (Year: 2019).*
(Continued)

*Primary Examiner* — Wyatt A Stoffa
(74) *Attorney, Agent, or Firm* — Theodore M. Magee; Westman, Champlin & Koehler, P.A.

(57) ABSTRACT

A method includes parallel or serial ionization of a gas mixture by activating at least two ionization devices operating using different ionization procedures, and/or by ionizing the gas mixture in a detector to which the gas mixture and ions and/or metastable particles of an ionization gas are fed. The method also includes detecting the ionized gas mixture in the detector for the mass spectrometric examination thereof. A mass spectrometer for mass spectrometric examination of gas mixtures includes an ionization unit for ionizing a gas mixture and a detector for detecting the ionized gas mixture.

20 Claims, 3 Drawing Sheets

Related U.S. Application Data application No. PCT/EP2014/051520, filed on Jan. 27, 2014.

(60) Provisional application No. 61/758,308, filed on Jan. 30, 2013.

(51) Int. Cl.
| | | |
|---|---|---|
| H01J 49/14 | (2006.01) | |
| C23C 16/52 | (2006.01) | |
| C23C 16/44 | (2006.01) | |
| H01J 37/32 | (2006.01) | |
| H01J 49/42 | (2006.01) | |

(52) U.S. Cl.
CPC ...... *H01J 37/32862* (2013.01); *H01J 49/009* (2013.01); *H01J 49/10* (2013.01); *H01J 49/105* (2013.01); *H01J 49/107* (2013.01); *H01J 49/145* (2013.01); *H01J 49/424* (2013.01); *H01J 2237/335* (2013.01)

(58) Field of Classification Search
CPC ........ H01J 49/10; H01J 49/105; H01J 49/107; H01J 49/145; H01J 49/424
See application file for complete search history.

(56) References Cited

U.S. PATENT DOCUMENTS

| | | | | |
|---|---|---|---|---|
| 5,493,115 A * | 2/1996 | Deinzer | H01J 49/147 | 250/281 |
| 5,679,950 A * | 10/1997 | Baba | G01N 21/6404 | 250/281 |
| 5,714,755 A * | 2/1998 | Wells | H01J 49/424 | 250/281 |
| 5,756,996 A * | 5/1998 | Bier | H01J 49/145 | 250/286 |
| 6,294,780 B1 * | 9/2001 | Wells | H01J 49/147 | 250/288 |
| 6,329,653 B1 | 12/2001 | Syage et al. | | |
| 7,064,323 B2 * | 6/2006 | Yamakoshi | H01J 49/162 | 250/281 |
| 7,973,277 B2 * | 7/2011 | Rafferty | H01J 49/424 | 250/282 |
| 8,933,399 B2 * | 1/2015 | Sampei | H01J 37/32862 | 250/288 |
| 2002/0036263 A1 | 3/2002 | Shiokawa et al. | | |
| 2002/0053636 A1 * | 5/2002 | Shiokawa | H01J 49/145 | 250/281 |
| 2002/0139930 A1 | 10/2002 | Shiokawa et al. | | |
| 2005/0009172 A1 * | 1/2005 | Yamakoshi | H01J 49/162 | 435/287.2 |
| 2005/0279932 A1 * | 12/2005 | Wang | H01J 49/4225 | 250/290 |
| 2006/0186331 A1 * | 8/2006 | Hartmer | H01J 49/0072 | 250/288 |
| 2007/0007448 A1 * | 1/2007 | Wang | H01J 49/16 | 250/288 |
| 2007/0023648 A1 * | 2/2007 | Baba | H01J 49/145 | 250/294 |
| 2007/0114438 A1 * | 5/2007 | Holle | H01J 49/10 | 250/423 R |
| 2008/0128611 A1 * | 6/2008 | McLuckey | H01J 49/4295 | 250/283 |
| 2009/0095902 A1 * | 4/2009 | Robinson | H01J 49/145 | 250/287 |
| 2009/0194679 A1 * | 8/2009 | Doherty | H01J 49/0045 | 250/282 |
| 2009/0230302 A1 * | 9/2009 | Hunt | H01J 49/423 | 250/282 |
| 2009/0321624 A1 * | 12/2009 | Fang | H01J 49/422 | 250/281 |
| 2010/0084549 A1 * | 4/2010 | Ermakov | H01J 49/4245 | 250/283 |
| 2010/0181471 A1 * | 7/2010 | Pop | G01V 9/00 | 250/254 |
| 2011/0108726 A1 * | 5/2011 | Hiraoka | H05H 1/2406 | 250/282 |
| 2011/0186724 A1 * | 8/2011 | Nolting | H01J 49/0072 | 250/282 |
| 2011/0211179 A1 | 9/2011 | Kraus et al. | | |
| 2011/0240848 A1 * | 10/2011 | Wells | H01J 49/145 | 250/283 |
| 2011/0253889 A1 | 10/2011 | Ishimaru et al. | | |
| 2011/0284733 A1 * | 11/2011 | Chen | H01J 49/025 | 250/282 |
| 2012/0056087 A1 * | 3/2012 | Ahn | H01J 49/424 | 250/288 |
| 2012/0112056 A1 * | 5/2012 | Brucker | H01J 49/4245 | 250/282 |
| 2012/0160997 A1 | 6/2012 | Fink et al. | | |
| 2012/0292495 A1 * | 11/2012 | Hashimoto | H01J 49/423 | 250/281 |
| 2012/0326022 A1 | 12/2012 | Kumano et al. | | |
| 2013/0048851 A1 * | 2/2013 | Kumano | H01J 49/0431 | 250/282 |
| 2013/0193318 A1 * | 8/2013 | Land | H01J 49/10 | 250/282 |
| 2013/0203180 A1 * | 8/2013 | Robinson | G01N 27/62 | 436/173 |
| 2014/0103207 A1 | 4/2014 | Sampei et al. | | |
| 2014/0145073 A1 * | 5/2014 | Johnson | H01J 49/10 | 250/282 |
| 2014/0158880 A1 * | 6/2014 | Yang | H01J 49/421 | 250/282 |
| 2014/0175276 A1 * | 6/2014 | Giuliani | H01J 49/0081 | 250/282 |
| 2015/0028882 A1 * | 1/2015 | Brucker | F04B 37/06 | 324/469 |
| 2015/0097114 A1 * | 4/2015 | Green | H01J 49/10 | 250/282 |
| 2015/0235829 A1 | 8/2015 | Chung et al. | | |
| 2015/0262807 A1 * | 9/2015 | Nakamura | H01J 49/4215 | 250/288 |
| 2016/0042936 A1 * | 2/2016 | Brown | H01J 49/10 | 250/286 |

FOREIGN PATENT DOCUMENTS

| | | |
|---|---|---|
| JP | H09-7539 A | 1/1997 |
| JP | 2000-339812 A | 12/2000 |
| JP | 2004-39313 A | 2/2004 |
| JP | 2005-085512 A | 3/2005 |
| JP | 2005-353340 | 12/2005 |
| JP | 2008-209312 | 9/2008 |
| JP | 2011-511929 A | 4/2011 |
| TW | M437457 | 9/2012 |
| WO | WO 02/00962 A1 | 1/2002 |
| WO | WO 2009/048739 A2 | 4/2009 |
| WO | WO 2012/0165053 | 12/2012 |

OTHER PUBLICATIONS

Korean office action with English translation from the parallel Korean App. Ser. No. 10-2015-7012289, dated Feb. 13, 2017, 11 pages.

Japanese Office Action, with translation thereof, for JP Appl No. 2015-552106, dated Jun. 21, 2017.

Japanese Office Action, with translation thereof, for JP Appl No. 2015-552106, dated Jul. 26, 2016.

International Search Report and Written Opinion for corresponding PCT Appl No. PCT/EP2014/051520, dated Oct. 10, 2014.

International Preliminary Report on Patentability for corresponding International Application No. PCT/EP2014/051520, 14 pages, dated Aug. 13, 2015.

Arsenault et al., "Alternate or Simultaneous Electron Impact-Chemical Ionization Mass Spectrometry of Gas Chromatographic (56) References Cited

OTHER PUBLICATIONS

Effluent," Analytical Chemistry, vol. 43, No. 12, Oct. 1, 1971, pp. 1720-1722.
German Office Action, with translation thereof, for corresponding DE Appl No. 10 2013 201 499.6, dated Dec. 23, 2014.
Korean Office Action, with translation thereof, for corresponding Appl No. 2015-7012289, dated Sep. 26, 2017.
European Office Action for corresponding Appl No. 14701405.4, dated Nov. 30, 2017.
Taiwanese Office Action, with translation thereof, for corresponding Appl No. 103103636, dated Apr. 30, 2018.
Japanese Office Action, with translation thereof, for corresponding JP Appl No. 2017-202669, dated Sep. 26, 2018.

* cited by examiner

METHOD FOR MASS SPECTROMETRIC EXAMINATION OF GAS MIXTURES AND MASS SPECTROMETER THEREFOR

CROSS-REFERENCE TO RELATED APPLICATIONS

The present application is a divisional of, and claims benefit under 35 USC 120 to, U.S. application Ser. No. 14/658,577, filed Mar. 16, 2015, which is a continuation of, and claims benefit under 35 USC 120 to, international application PCT/EP2014/051520, filed Jan. 27, 2014, which claims benefit under 35 USC 119 of German Application No. 10 2013 201 499.6, filed Jan. 30, 2013. International application PCT/EP2014/051520 also claims priority under 35 USC 119(e) to U.S. Provisional Application No. 61/758,308, filed Jan. 30, 2013. The entire disclosure of U.S. application Ser. No. 14/658,577, international application PCT/EP2014/051520 and of German Application No. 10 2012 208 064.3 are incorporated by reference herein.

BACKGROUND OF THE INVENTION

The invention relates to a method for mass spectrometric examination of a gas mixture. The invention also relates to a mass spectrometer for mass spectrometric examination of gas mixtures comprising an ionization unit and a detector.

During the mass spectrometric examination of gaseous substances, which may have applications in different technical fields, the mass or the mass-to-charge ratio of atoms or molecules is determined in order to obtain a chemical characterization of the gaseous substances. The substances to be examined or the substance mixture to be examined is either already available in the gas phase or it is transformed into the gas phase in order to be ionized via an ionization unit. The substances ionized in this manner are fed to an analyzer and typically routed through an electric and/or magnetic field, in which the ions describe characteristic trajectories due to different mass-to-charge ratios and are therefore able to be distinguished. As a result of separating or fanning the ionized substances out in an electromagnetic field, it is possible to sort different substances or fragments of the substances to be examined in the analyzer according to the mass-to-charge ratio. Finally, a detection of the ions previously separated spatially is carried out via a typically spatially resolving detector.

Conventional methods for mass spectrometric examination of gaseous substances often exhibit the disadvantage of there being a fragmentation or breaking up of the molecules of the substances to be examined, for example when these are fanned out in the analyzer, but in particular during the ionization in the ionization unit. Such fragmentation is often undesirable since it may make the chemical characterization of the substance to be examined more difficult.

Various ionization procedures are known for ionizing substances to be examined. Conventional mass spectrometers typically have a single ionization unit, which is adapted to the type of substance to be examined, i.e. via which a single ionization procedure can be carried out. Accordingly, operators of a mass spectrometer must, for the purposes of chemical characterization of the substance to be examined, already have a relatively good idea in advance about the type of substance or substance mixture in order to use an appropriate mass spectrometer for the examination and to carry out the mass spectrometric examination. If analysis of completely unknown substances is to be carried out, the mass spectrometric examination via a mass spectrometer may be found to be unsuitable. However, further examinations are generally connected to delays and may be problematic as a result of only a small amount of samples of the substance to be examined being available.

WO 02/00962 A1 has disclosed an in-situ cleaning system for removing deposits produced by process gases in a sample chamber of a process monitor in a wafer production apparatus. A probe head of a gas analyzer is arranged in the sample chamber in order to analyze a gas sample ionized via a plasma. Deposits setting in over the course of one or more analyses in the sample chamber or on the probe head can, when necessary, be removed via a cleaning gas. When plasma is produced in the sample chamber, the cleaning gas forms a gaseous cleaning product with the deposits, which cleaning product is discharged from the sample chamber.

Object of the Invention

It is an object of the invention to provide a method and a mass spectrometer which enable a simple and economical mass spectrometric examination of gas mixtures and, in particular, remove the disadvantages mentioned at the outset.

Subject Matter of the Invention

This object is achieved by a method for mass spectrometric examination of a gas mixture, comprising the following method steps: parallel or serial ionization of the gas mixture to be examined by activating of at least two ionization devices operating using different ionization procedures, and/or ionizing of the gas mixture, in particular by charge exchange ionization, in a detector, to which the gas mixture and ions and/or metastable particles of an ionization gas, which are produced by an ionization device, in particular a plasma ionization device, are fed, and detecting of the ionized gas mixture in the detector for the mass spectrometric examination thereof.

As a result of the method according to the invention, it is possible to combine the advantages of the various ionization procedures, which can be applied via the appropriate ionization devices, in an advantageous manner and adapt these to the individual conditions of the mass spectrometric examination. By way of example, a combined application of different ionization procedures is advantageous if the ionization of gas mixtures to be examined cannot be achieved by a single ionization procedure alone due to constituents with e.g. macromolecular size. It is further possible that the environmental conditions (pressure, temperature) change during the examination of a gas mixture in such a way that specific ionization procedures cannot be applied all the time, but have to be replaced or at least complemented by other procedures. As a result of the method according to the invention, it is possible to make statements about the chemical composition or the structure of the examined gas mixture and optionally draw conclusions about the origin thereof in an overall system (for example, a lithography apparatus, a production apparatus in the chemical industry or the like). In particular, it is possible to react to the individual requirements which emerge for different substances to be examined that are contained in the gas mixture.

The different ionization procedures of the plurality of ionization devices (at least two) can be freely selected depending on requirements (depending on the type of the gas mixture to be examined). Here, the ionization devices can be arranged in parallel or in series for ionizing the gas mixture and can be activated selectively. In the case of a parallel connection or a parallel ionization of the gas mixture, a first part of the gas mixture to be examined is ionized via a first ionization device and a second part of the gas mixture to be examined is ionized via a second ionization device, wherein the first and the second ionization device are arranged spatially separated next to one another. Alternatively, in the case of a serial connection or serial ionization of the gas mixture, the gas mixture to be examined can initially be ionized via a first ionization device and subsequently be ionized via a second ionization device, which is spatially separated from the first ionization device. If three or more ionization devices are present, there can also be a combination of serial and parallel ionization of the gas mixture.

Alternatively, or in addition thereto, the gas mixture can be ionized directly in the detector, i.e. in the measuring cell, which, for example, can be embodied as an ion trap or can contain an ion trap. In this case, the gas mixture is typically led to the detector in a non-ionized state and the ionization only takes place directly in the detector. As a result of this, all ions produced in the measuring cell or in the detector can be analyzed directly. Furthermore, this ionization procedure can be carried out on its own, i.e. without the provision of other ionization procedures. However, it is optionally also possible in this variant to already ionize part of the gas mixture upstream of the detector. The ionization can be brought about by ions of the ionization gas and/or by metastable particles of the ionization gas. Metastable particles are understood to mean atoms or molecules of the ionization gas, which are put into an excited electron state during the ionization.

The ionization in the detector can be implemented by e.g. a plasma ionization. The plasma or the ions of an ionization gas are generated in this case in a plasma source outside of the detector and the ionization takes place in the detector by impact ionization or charge exchange ionization of the gas mixture. A large number of gases or gas mixtures can serve as ionization gas, e.g. He, $H_2$, Ar, $N_2$, Xe, Kr, $CH_4$ etc.

In the present case, the gas mixture to be examined is understood to mean mixtures of gaseous substances, in which, in particular, particles may also be contained. The measurement chamber, in which the detection of the ionized substance or substances takes place, may, in principle, be any chamber of a mass spectrometer, in particular a detector chamber (for example a detector chamber with an ion trap arranged therein), which e.g. is provided in a lithography apparatus, a (chemical) production apparatus or the like.

In an advantageous variant of the method, the gas mixture comprises particles which have an atomic mass number of between 100 and 20 000 or of between 20 000 and 2 000 000. Conventional gases generally have an atomic mass number of less than 100. Using the method proposed here, it is also possible to examine particles (i.e. gaseous substances with a mass number >100), which optionally have a macromolecular structure, in respect of the chemical composition thereof. Particles with an atomic mass number (in atomic mass units; AMU) of more than 100 or an atomic mass number of between 1000 and 20 000 may have particle sizes of approximately 0.01-10 μm or more. As a result of the (plasma) ionization in the detector, or by the combination of a plurality of ionization procedures, it is possible to detect both comparatively small and comparatively large particles (with mass numbers of greater than 20 000). A quantitative statement about the particle mass-to-charge ratio and, in particular, about the particle number in a volume to be monitored, e.g. in a process chamber, a chamber of an EUV lithography apparatus or the like, can be made in situ, in particular in combination with an FTIT measuring cell (see below).

In a preferred variant of the method, the energy provided for the ionization is set depending on the gas mixture to be ionized. The option of (ideally continuously) setting or adapting the energy provided during the ionization to the gaseous substances or particles to be ionized (and to be detected), more precisely to the ionization energy thereof, was found to be advantageous since this supports both a (common) ionization of all types of gaseous substances and particles (broadband ionization) and a selective, narrowband ionization of selected substances without ionizing other surrounding substances (e.g. a carrier gas). Hence, it is possible to ionize and detect selected types of particles (e.g. contaminating substances, in particular hydrocarbons) in a targeted manner. As described above, the provided energy can be set in a targeted manner dependent on the gas mixtures to be ionized, but it is also possible to tune the energy continuously. Setting the energy provided for the ionization dependent on the gas mixture to be ionized is advantageously possible, in particular in the case of the so-called charge exchange ionization (see below).

In a preferred method variant, at least one of the ionization procedures is selected from the following group: charge exchange ionization, electron impact ionization, ionization via a filament, field ionization, ionization via a pulsed laser, photon ionization, in particular UV light ionization, VUV light ionization or EUV light ionization.

During the charge exchange ionization, an electron of a neutral gaseous substance is typically transferred to an ionized gaseous substance. By way of example, the charge exchange can be excited by a plasma. In the case of electron impact ionization, electrons are released from an electrically heated filament and accelerated by an electric field to kinetic energies of generally between 5 eV and 200 eV (usually approximately 70 eV for stability reasons) and led through the gas mixture to be ionized. When the electrons impact on the molecules or atoms of the substance to be examined, these are ionized. In the case of field ionization, electrons are released from their bond by a sufficiently strong electric field. The field ionization can be used in high vacuum and in ultra-high vacuum and, compared to ionization via a filament, does not lead to a possibly undesired temperature increase. Furthermore, molecules are not fragmented much during field ionization, as a result of which mixtures of a plurality of substances can also be examined well. Ionization with the aid of radiation, so-called photon ionization, is also possible. Here, use is typically made of radiation in the UV wavelength range, in the VUV wavelength range (with wavelengths less than 200 nm) and/or in the EUV wavelength range (with wavelengths between approximately 5 nm and approximately 20 nm), which radiation has sufficiently high energy so that a single photon of this radiation can overcome the ionization energy of the gaseous substance to be examined.

It is understood that it is also possible to use additional ionization procedures to the ones described above in order to ionize the substances to be examined, wherein each of these individual, different ionization procedures exhibits individual advantages when ionizing gas mixtures (gaseous substances and/or particles), which can be used when necessary without delay and/or without re-tooling effort.

A variant of the method, wherein the gas mixture is ionized at least in part by the plasma of at least one ionization device embodied as a plasma ionization device, is also preferred. In this case, the gas mixture can be ionized both directly in the detector (of the measuring cell/ion trap) by impact ionization or charge exchange ionization, but there can also be an ionization of the gas mixture in an external plasma source and the gas mixture or parts of the gas mixture is/are fed to the detector in the ionized state. During the plasma ionization, different substances with the same mass number or the same mass-to-charge ratio are advantageously ionized with a different frequency or to a different extent by the plasma due to their typically differing ionization energies, and so it is possible to distinguish between different substances with the same mass number by using analytical comparisons. It is also possible for the ionization optionally to take place by the generation of a gentle plasma, which does not break up the substances to be examined into a number of fragments, and so these substances remain (largely) unchanged in terms of their chemical structure during the ionization. In the case where the energy provided for the ionization in the plasma ionization device is set dependent on the gas mixture to be ionized, the plasma ionization device can comprise a control device, which enables the aforementioned tuning by, for example, a variation in the amplitude or optionally in the frequency of an electric or electromagnetic field produced in the plasma ionization device.

Furthermore, a variant of the method wherein the plasma ionization device produces the plasma by a dielectric barrier discharge is preferred. As a result of this particularly gentle ionization (e.g. in the form of charge exchange), it is possible to ionize entire linked together macromolecular structures (particles) and not only individual molecules or molecule fragments in a particularly simple manner. The ionization by a dielectric barrier discharge (DBD) can furthermore advantageously take place at comparatively low temperatures of e.g. 10° C. to 200° C. In particular, it is possible to ionize gas mixtures which, in addition to gaseous substances with a mass number of between 1 and 100, also comprise particles with an atomic mass number of between 100 and 200, an atomic mass number of between 200 and 20 000, or even an atomic mass number of between 20 000 and 2 000 000. In the case of the dielectric barrier discharge, a thin dielectric, which serves as dielectric barrier, is situated between two electrodes in order to produce a plasma in the form of a multiplicity of spark discharges and thus ionize a gas flow situated between the electrodes. The use of a dielectric barrier discharge is possible using different excitation frequencies, such as e.g. direct current, medium frequency or high frequency.

In a further preferred method variant, the plasma of the plasma ionization device is a radiofrequency plasma (RF plasma) or a direct current plasma (DC plasma). As a result of a particularly gentle ionization via an RF plasma or DC plasma, it is likewise possible to ionize gas mixtures without fragmentation occurring. The ionization by an RF plasma or a DC plasma can likewise occur at comparatively low temperatures of 10° C. to 200° C. and therefore does not require comprehensive protection measures. In particular, it is also possible to ionize substances or particles that have an atomic mass number of between 100 and 200, an atomic mass number of between 200 and 20 000 or of between 20 000 and 2 000 000. In order to produce the RF plasma, a radiofrequency discharge can be ignited between e.g. two electrodes. It is understood that the production or excitation of an RF plasma can also be brought about in a manner different to that described above. The RF plasma can also be a plasma produced in a pressure range that also lies in the region of atmospheric pressure or above the atmospheric pressure range.

A method variant, wherein, in a method step preceding (and/or following) the ionization of the gas mixture, a plasma produced by the plasma ionization device is used to clean the detector, a measurement chamber, in which the detector is arranged, and/or to clean the further ionization devices is also preferred. By using the plasma produced by the plasma ionization device for cleaning the detector, the measurement chamber and/or the further ionization devices, self-cleaning is advantageously possible. This self-cleaning can be carried out via the plasma ionization device provided for ionizing the gas mixture, which is particularly simple and economical for the overall system. Conventional cleaning methods such as filament outgassing, which is generally applied in the case of ionization via a heated filament, or the baking of the overall system, which cleaning methods, in principle, are able to reduce the level of contamination of the measurement chamber in a mass spectrometer, either reduce the service life of the filament, and hence the potential usage time of the mass spectrometer, or require much time. By contrast, the cleaning method described here does not have these disadvantages. Cleaning the measurement chamber or the ionization device(s) via such conventional means or methods can be dispensed with in the case of the cleaning method described here and the plasma ionization device already present can be used in an economically advantageous manner from two different aspects (both for ionizing gas mixtures during the actual examination or detection operation and for self-cleaning). In particular, the plasma ionization device can serve for cleaning a further ionization device embodied as a filament.

In a further preferred variant, the cleaning comprises the following method steps: producing the plasma via a plasma gas for transforming contaminants deposited in the detector, in the measurement chamber and/or on the (further) ionization devices into the gas phase, and removing the contaminants (transformed into the gas phase) from the detector, the measurement chamber and/or the ionization devices. The cleaning plasma reacts with the contaminants or the contaminations (e.g. particles deposited in the chamber), as a result of which volatile compounds are produced, which can be discharged from the measurement chamber (for example by ventilating or pumping away). The contaminants are preferably removed via a pump device. In order to remove the contaminants, use can be made either of a pump device provided especially for this purpose, as a result of which there can be a particularly effective removal of the contaminants from the measurement chamber to be cleaned. Alternatively, or in addition thereto, use can also be made of a pump device assigned to the mass spectrometer in any case, for example for evacuating available (measurement) chambers. In the latter case, there is a more economical operation of the method.

Transforming contaminants into the gas phase can be brought about by a chemical reaction of the plasma gas or of the plasma with the contaminants to form volatile compounds. By way of example, contaminants can be hydrocarbon compounds or fluorides or Teflon. The plasma gas is generally ignited in the measurement chamber in order to produce the plasma. In principle, the plasma gas used during the production of the plasma for self-cleaning can be the gaseous substance (i.e. the gas or gas mixture) itself or a carrier gas for this gaseous substance, which is examined by mass spectroscopy. However, use is typically made of a plasma gas provided especially for self-cleaning.

An inert gas, for example helium and/or argon, which were found to be plasma gases with particularly good cleaning effect, can be used as plasma gas. It is understood that mixtures of these or optionally of other gases, such as e.g. hydrogen and/or oxygen, which perform a chemical reaction with the contaminants, can also be used as plasma gases.

Moreover, a method variant is preferred, wherein the cleaning of the measurement chamber takes place at an operating pressure of between 1 bar and $1\times10^{-10}$ mbar, in particular of between 10 mbar and $1\times10^{-3}$ mbar. In order to achieve a particularly thorough cleaning effect, the measurement chamber to be cleaned is filled with the plasma gas (gas for producing the plasma) up to an operating pressure of between 1 bar and $1\times10^{-10}$ mbar, in particular in the plasma range between 10 mbar and $1\times10^{-3}$ mbar. After removing the contaminants from the measurement chamber, normal operating pressure is built up again, which may, for example when using a filament as ionization device, lie in the high vacuum. By way of example, the corresponding pressures can be set by a vacuum producing device, which, for example, can be embodied as pump device.

Furthermore, a variant of the method is preferred, wherein, during the method step for cleaning the detector, the measurement chamber and/or for cleaning the ionization devices, at least one further ionization procedure is employed for transforming the deposited contaminants into the gas phase in addition to producing the plasma. The additional use of further ionization procedures (for example simultaneously with plasma ionization) is advantageous if the contaminants to be removed cannot be converted into volatile compounds by the plasma ionization on its own. By way of example, this may be required in the case of particularly large (and/or compactly structured) contaminants. Accordingly, the further ionization procedures can be applied when necessary, in each case individually successively in time or together, in addition to the plasma ionization.

The further ionization procedure is preferably selected from the group: electron impact ionization, in particular ionization via a filament, field ionization and ionization via a pulsed laser. It is understood that these further ionization method(s) can be used in addition to the plasma ionization in order to ionize the substances to be examined. A variant of the method is also preferred, wherein, for detection purposes, more precisely for analysis and detection, the ionized gas mixture is led into a conventional detector, e.g. a quadrupole detector (or a quadrupole mass spectrometer) or stored or accumulated in an ion trap, which is selected from the group comprising: Fourier transform ion trap, in particular Fourier transform ion cyclotron resonance trap, Penning trap, toroidal trap, Paul trap, linear trap, orbitrap, EBIT and RF buncher. A conventional quadrupole ion trap can also be used as ion trap. If the ionized gas mixtures are accumulated in an ion trap for detection purposes, an "in situ" particle measurement is thus advantageously possible. Hence, there is no need for a conventional arrangement of an analyzer for mass- and charge-specific separation of the ionized substances (a further structural component) between the ionization device and a conventional detector, but the detection/measurement of the ionized substances in principle can be undertaken in the direct vicinity of the ionization device, i.e. in situ. In this variant in particular, it is advantageous if the ionization of the gas mixture takes place directly in the ion trap, in which the storage or the accumulation and the detection are also carried out.

In contrast to conventional process or residual gas analyzers, in which the ionized substances only pass through electromagnetic fields for a short period of time without being stored in these fields, it is possible to increase the detection sensitivity (mass resolution) by providing the ion trap since the substances to be analyzed are available for measurement for a relatively long time (typically for more than 1 ms). Furthermore, by accumulation via an ion trap, high dynamics (i.e. a particularly quick and sensitive evaluation of the particle composition or a particularly quick temporal conclusion about the ionized gas mixtures) are possible.

The ion trap is preferably embodied for detecting the ions stored or accumulated in the trap. The use of such an ion trap, for example an FT ion trap, enables the implementation of quick measurements (with scan times in the second range or faster, e.g. in the millisecond range). In this type of trap, the induction current, which is generated by the trapped ions on the measurement electrodes, is detected and amplified in a time-dependent manner. Subsequently, this time dependence is transformed into the frequency space by a frequency transform, such as e.g. a Fast Fourier Transform, and the mass dependence of the resonant frequencies of the ions is used to convert the frequency spectrum into a mass spectrum. Mass spectrometry via a Fourier transform can be carried out to carry out fast measurements, in principle with different types of ion traps (e.g. with the above-described types), wherein the combination with the so-called ion cyclotron resonance trap is the most common. The FT-ICR trap constitutes a development of the Penning trap, in which the ions are enclosed in alternating electric fields and a static magnetic field. In the FT-ICR trap (magnetic or electric ICR trap), mass spectrometry can be performed via cyclotron resonance excitation. In a development of this, the Penning trap can also be operated with an additional buffer gas, wherein a mass selection by spatial separation of the ions can be generated by the buffer gas in combination with a magnetron excitation via an electric dipole field and a cyclotron excitation via an electric quadrupole field, such that the Penning trap can also be used for separating the substance to be detected from other substances. Since the buffer gas in this type of trap generally has a movement-damping and hence "cooling" effect on the enclosed ions, this type of trap is also referred to as "cooling trap". The so-called toroidal trap enables a more compact design compared to a conventional quadrupole trap, while substantially having an identical ion storage capacity. The linear trap is a development of the quadrupole trap or Paul trap, in which the ions are not held in a three-dimensional quadrupole field but rather in a two-dimensional quadrupole field via an additional edge field, in order to increase the storage capacity of the ion trap. The so-called orbitrap has a central, spindle-like electrode, about which the ions are kept on orbitals as a result of the electric attraction, wherein an oscillation along the axis of the central electrode is produced by an off-center injection of the ions, which oscillation generates signals in the detector plates, which signals can be detected like in the case of the FT-ICR trap (by FT). An EBIT (electron beam ion trap) is an ion trap, in which the ions are produced by impact ionization via an ion gun, wherein the ions produced thus are attracted by the electron beam and trapped by the latter. The ions can also be stored in an RF (radiofrequency) buncher, for example a so-called RFQ (quadrupole) buncher. It is understood that, in addition to the above-listed types of traps, it is also possible to use other types of ion traps for residual gas analysis, which other types of traps can be optionally combined with an evaluation using a Fourier transform.

The object is furthermore achieved by a mass spectrometer of the type mentioned in the introduction, in which the ionization unit comprises at least two ionization devices, arranged in parallel or in series, for ionizing the gas mixture via different ionization procedures, wherein the ionization devices alternatively can be activated individually or (at least two of the ionization devices can be activated) together. Alternatively, or in addition thereto, the ionization unit can have an ionization device, in particular a plasma ionization device configured to feed ions and/or metastable particles of an ionization gas to the detector in order to ionize the gas mixture in the detector, to be precise typically by charge exchange ionization or impact ionization.

The impact ionization or charge exchange ionization directly in the measuring cell or in the detector can take place on its own, i.e. without the provision of additional ionization units in the mass spectrometer; however, it is also possible that the ionization device for charge exchange ionization or impact ionization of the gas mixture in the detector is provided as one of several ionization devices in the mass spectrometer. The mass spectrometer according to the invention results substantially in the same advantages as the method according to the invention.

The ionization devices being activated together should be understand to mean that, in the case where e.g. three ionization devices are provided, for example two or three of these ionization devices are activated together at a given time. The ionization devices can be connected in parallel or in series, so that, in the case of their common activation, the ionization devices can be employed at the same time or in succession for ionizing the same gaseous substance or substance mixture. Alternatively, or in addition thereto, two or more of the ionization devices can be connected to a common feed channel, in order to enable a feed of the substances to be examined to one, or optionally more ionization devices, for simultaneous ionization with the aid of several different ionization procedures. The ionized substances to be examined can be fed to the measurement chamber or to the detector by a pipe connection or there can be impact ionization or charge exchange ionization of the gas mixture directly in the detector (in particular of an ion trap).

In a preferred embodiment of the mass spectrometer, the ionization devices are selected from the group comprising: charge exchange ionization device, plasma ionization device, electron impact ionization device, in particular filament ionization device, field ionization device, laser ionization device, photon ionization device, in particular UV light ionization device, VUV light ionization device and EUV light ionization device. In the case of plasma ionization via inductively coupled plasma (ICP), most substances or compounds are broken up into their elements, wherein predominantly singly positively charged ions are produced, and so this procedure is substantially used in inorganic element analysis and trace analysis. The gentle plasmas of specific other plasma ionization devices (e.g. dielectric barrier discharge, RF plasma, glow plasma, plasma at atmospheric pressure) do not break up most of the substances to be examined into their elements as a result of charge exchange, as a result of which the substance to be examined remains almost unchanged in terms of its structure and a simplified chemical characterization is possible.

Moreover, in the case of the plasma ionization, different gases with the same mass number or the same mass-to-charge ratio are advantageously ionized by the plasma with different frequencies due to their typically differing ionization energies, and so it is possible to differentiate between different substances with the same mass number by analytical comparisons. During electron impact ionization, electrons are generally released from an electrically heated filament and accelerated to high kinetic energies through an electric field in order to ionize the substance to be examined. In the case of field ionization, electrons are released from their bonds by a sufficiently strong electric field. The field ionization can be used in high vacuum and in ultra-high vacuum and, compared to ionization via a filament, does not lead to a possibly undesired temperature increase. Furthermore, molecules are not fragmented much during field ionization, as a result of which gas mixtures can also be examined. It is understood that devices for chemical ionization, for electrospray ionization, for atmospheric pressure chemical ionization, for one photon ionization, for resonance-amplified multi-proton ionization, for matrix-supported laser desorption/ionization, for ionization via inductively coupled plasma or for ionization via glow plasma by charge exchange ionization can be provided as ionization devices.

In a further preferred embodiment, the plasma ionization device is selected from the group comprising: high frequency plasma source, medium frequency plasma source, direct current plasma source, dielectric barrier discharge plasma source, atmospheric pressure plasma source and corona discharge plasma source. The plasma can be excited by direct current, but it is also possible to use an (alternating) electromagnetic field for the excitation, e.g. a high frequency alternating field (with frequencies from 1 MHz to 30 MHz) or a medium frequency alternating field (with frequencies from 3 kHz to 1 MHz). In the case of plasma ionization by a dielectric RF discharge, particularly gentle ionization can be achieved and it is possible to ionize linked macromolecular structures (particles) and not only individual molecules or molecule fragments. The ionization by an RF discharge can advantageously occur at temperatures from 10° C. to 200° C. In particular, it is possible to ionize particles with an atomic mass number of between 100 and 20 000 or of between 20 000 and 2 000 000. The use of a dielectric barrier radiofrequency discharge is also possible. In the case of ionization via an atmospheric pressure plasma source, it is likewise possible to achieve particularly gentle ionization, via which entire linked macromolecular structures (particles) and not only individual molecules or molecule fragments are ionized. In order to generate atmospheric pressure plasmas, it is possible e.g. to ignite a radiofrequency or medium-frequency discharge between two electrodes.

In a further embodiment, the mass spectrometer comprises an ion trap for storing or accumulating the ionized gas mixture, which ion trap is selected from the group comprising: Fourier transform ion trap, in particular Fourier transform ion cyclotron resonance trap, Penning trap, toroidal trap, Paul trap, linear trap, orbitrap, EBIT and RF buncher. The ion trap can be arranged in the measurement chamber, in which the detector is arranged. In particular, the ion trap can also be integrated in the detector. Furthermore, the ion trap can form the detector itself, as is the case, for example, when using an ion trap in the form of an FT-ICR trap or orbitrap, in which it is also possible to detect the ions trapped in the ion trap in addition to storing these.

Further features and advantages of the invention emerge from the following description of exemplary embodiments of the invention, on the basis of the figures of the drawing, which show details essential to the invention, and from the claims. The individual features in each case can be implemented on their own or several together in any combination in a variant of the invention.

DRAWING

Exemplary embodiments are depicted in the schematic drawing and will be explained in the following description. In detail.

In the following description of the drawing, identical reference signs are used for identical components or components with identical function.

Figure 1:
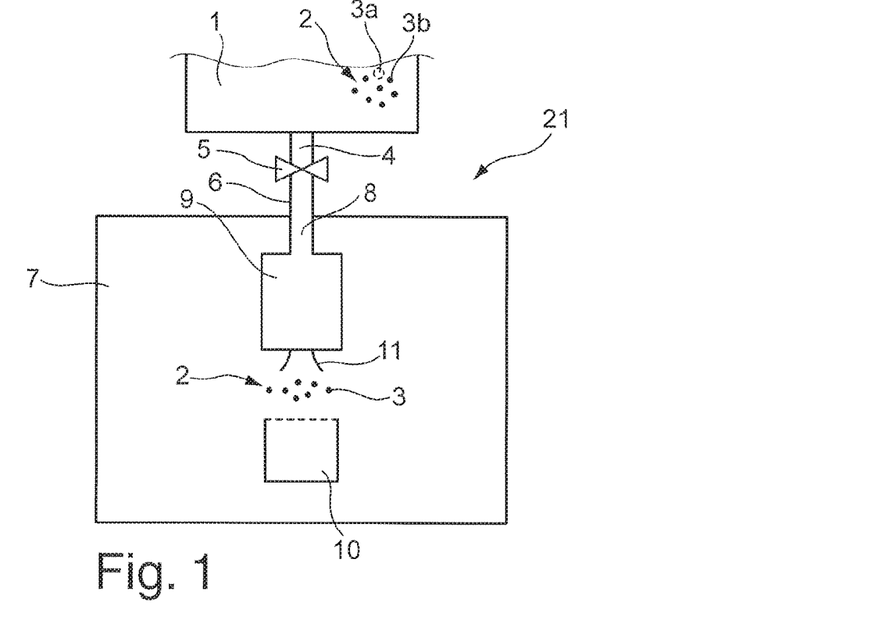
FIG. 1 shows a schematic representation of a mass spectrometer for mass spectrometric examination of gas mixtures.

FIG. 1 depicts a section of a chamber 1, which is a process chamber in the current example, forming part of an industrial apparatus in which an industrial process is carried out. The chamber 1 can alternatively be e.g. a (vacuum) housing of a lithography apparatus. Situated in the interior of the process chamber 1 is a gas atmosphere, which contains at least one gas mixture 2 to be examined. In the shown example, the gas mixture 2 has a substance 3a present in the gas phase (i.e. a gas) with an atomic mass number <100 and particles 3b with mass numbers of 100 or more. In the present case, the gas mixture 2 is residual gas 3a, in which a plurality of particles 3b situated in the chamber 1 are held. The chamber 1 has an outlet 4, which is connected to the inlet 6 of a measurement chamber 7, in particular directly connected to an inlet 8 of a plasma ionization device 9 arranged within the measurement chamber 7, via a valve 5. Furthermore, a detector embodied as ion trap 10 is arranged in the interior of the measurement chamber 7. In place of an ion trap 10, which serves both as analyzer and as detector, use can also be made of a conventional detector or a conventional spectrometer, for example a conventional (quadrupole) spectrometer, which fulfills the functions of analysis and detection.

For the mass spectrometric examination of the gas mixture 2 from the process chamber 1, the valve 5 between the process chamber 1 and the measurement chamber 7 is opened, and so a flow of the gas mixture 2 from the process chamber 1 into the plasma ionization device 9 sets in. The gas mixture 2, which has thus reached the plasma ionization device 9, is then ionized via a plasma produced by the plasma ionization device 9 but not depicted in FIG. 1. The plasma from the plasma ionization device 9 in FIG. 1 is a radiofrequency plasma (RF plasma), which enables particularly gentle ionization of the gas mixture 2 such that gas mixtures 2, which have particles 3b with an atomic mass number of between 100 and 20 000, in particular of between 20 000 and 2 000 000, can be ionized as linked macromolecular structure, which is not fragmented further by the RF plasma. By way of example, the particles 3b can be macromolecular conglomerates with a particle size of approximately 0.01-10 μm or more.

The energy provided for the ionization by the plasma ionization device 9 can be set dependent on the gas mixture 2 to be ionized, in particular dependent on the type of particles 3b to be ionized. Hence, on the one hand, ionization of the gas mixture 2 (broadband ionization) is possible, but, on the other hand, a selective, narrowband ionization of individual types of gaseous substances 3a or of particles 3b is also supported. In order to set the ionization energy, the plasma ionization device 9 can have a control device (not depicted here), which enables this adaptation, for example by virtue of the field strength (optionally the frequency) of an electric or electromagnetic field being selected appropriately.

As an alternative to a plasma ionization device 9 which produces an RF plasma, it is also possible to provide a plasma ionization device which produces the plasma by a dielectric barrier discharge. In this form of excitation, a dielectric is situated between two electrodes (not depicted in FIG. 1), which dielectric serves as dielectric barrier in order to produce a plasma in the form of a multiplicity of spark discharges and thus ionize a gaseous substance 3a situated between the electrodes or the particles 3b. The use of other types of plasma ionization devices 9, such as e.g. glow plasma or a plasma at atmospheric pressure (atmospheric pressure plasma) is also possible.

The gas mixture 2 ionized in the plasma ionization device 9 reaches the measurement chamber 7 through an outlet 11 of the plasma ionization device 9. The gas mixture 2 is subsequently detected by the detector, embodied as an ion trap 10 in FIG. 1, in the form of an FT-ICR trap or by a conventional, continuously operated detector, e.g. a quadrupole detector or a quadrupole mass spectrometer. A feed device (not shown), for example in the form of an ion optical unit, can serve to feed the gas mixture 2 from the plasma ionization device to the detector 10. Furthermore, it is possible to place the ionization source directly in or on the detector 10, as described in more detail below on the basis of FIG. 4.

In principle, it is advantageous to carry out the mass spectrometric examination as quickly as possible, ideally in real time, i.e. within a few seconds or milliseconds, and evaluate the mass spectrum "dynamically". In order to achieve this, the electric FT-ICR ion trap 10 is particularly suitable, as the following description will show. The electric FT-ICR trap 10 comprises a ring electrode, to which a radiofrequency high voltage is applied, and two cover electrodes, which can serve both as image charge detectors and as excitation electrodes. In the preferred compact electric variant of an FT-ICR trap, ions are held trapped by a radiofrequency high voltage. If the ions experience a pulse excitation, they carry out characteristic oscillations in the high vacuum, depending on the mass/charge ratio (m/z), which oscillations are recorded by image charge detection at the cover electrodes. A low-distortion ion signal is obtained by forming the difference from the image charge signals at both cover electrodes. Via a low-noise amplifier (not depicted here) and a fast Fourier analysis (FFT) (likewise not depicted here) of the ion output signal, the characteristic ion frequencies and the intensities thereof are described. The frequency spectrum can subsequently be converted into a mass spectrum, which can be used for the chemical characterization of the substance mixture 2. The FT-ICR trap 10 therefore enables a direct detection or the direct recording of a mass spectrum without the use of an additional analyzer so that a fast examination of the ionized gas mixture 2 is made possible. In contrast to conventional mass spectrometers, in which the ionized molecules of the gas mixture 2 are only fed to a detector once for mass analysis, the provision of the ion trap 10 renders it possible to increase the detection sensitivity by multiple measurement of the same ion population. Here, the ionized molecules of the gas mixture 2 are available for measuring for a relatively long time, since it is only the image charges and not the ions themselves that are used for the mass analysis.

In order to simplify the flow of the gas mixture 2 into the plasma ionization device 9 from the process chamber 1, a transport device, for example in the style of a fan, can be provided in the region of the valve 5 or in the region of the outlet 4 from the process chamber 1, or in the region of the inlet 6 into the measurement chamber 7 or in the region of the inlet 8 into the plasma ionization device 9. For transporting gas mixtures 2 to the detector 10, the measurement chamber 7 can also be connected to a pump device (not shown in FIG. 1).

Figure 2:
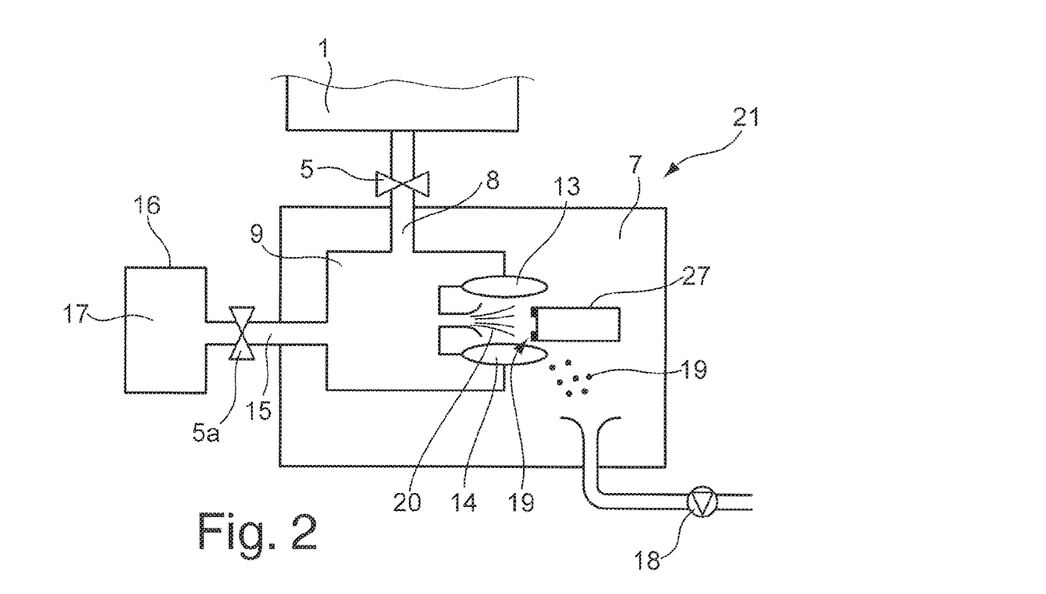
FIG. 2 shows a schematic representation of a mass spectrometer, in which self-cleaning of a measurement chamber is carried out.

FIG. 2 shows a mass spectrometer 21, which is embodied for carrying out self-cleaning of the measurement chamber 7. The plasma ionization device 9 is an ionization device which produces a plasma. To this end, a radiofrequency discharge is ignited between two electrodes 13, 14. The gas (with the gas mixture 2 to be examined) fed from the process chamber 1 can serve to produce the plasma, which gas is fed to a detector not shown in FIG. 2.

The plasma ionization device 9 is connected by a further pipe-shaped connection 15 to a storage container 16 for a plasma gas 17 that can be fed to the plasma ionization device 9 via a further valve 5a. By way of example, hydrogen ($H_2$), helium (He), argon (Ar) or oxygen ($O_2$) can be provided as plasma gas 17. A pump device 18 for evacuating the measurement chamber 7 or for removing a (residual gas) atmosphere and possible contaminants 19 contained therein (see below) is furthermore arranged in the region of the measurement chamber 7.

In order to carry out the self-cleaning of the measurement chamber 7, the valve 5 is closed and the measurement chamber 7 is separated from the process chamber 1 in a first method step. Subsequently, the plasma gas 17 from the storage container 16 is fed to the plasma ionization device 9, until a pressure of between approximately 1 bar and $1 \times 10^{-10}$ mbar, preferably of between 10 mbar and $1 \times 10^{-3}$ mbar sets in in the measurement chamber. As a result of this, the cleaning effect of the self-cleaning method is particularly effective.

After feeding the plasma gas 17, a plasma 20 is produced between the electrodes 13, 14 in the plasma ionization device 9. Here, the plasma ionization device 9 is aligned within the measurement chamber 7 in such a way that the plasma 20 reaches the region of contaminants 19, which, for example, have been deposited on an inner structure 27 of the measurement chamber 7. The inner structure 27 can be a further ionization device, e.g. in the form of a filament, on which contaminants, e.g. in the form of hydrocarbons, have been deposited. The contaminants 19 may also have been deposited on a detector (not depicted in FIG. 2) situated in the measurement chamber 7. It is understood that, unlike as depicted in FIG. 2, the plasma ionization device 9 may optionally be embodied in such a way that a plasma is produced in (almost) the entire measurement chamber 7.

As a result of the fact that the contaminants 19 (e.g. particles deposited on a filament) are exposed to the produced plasma 20 (an RF plasma in the present case), a conversion or decomposition of the contaminants 19 sets in, which converts the contaminants 19 into volatile compounds, wherein the decomposition or conversion can be brought about by a chemical reaction with the plasma gas 17 or optionally merely by splitting the contaminants 19 up into a plurality of highly volatile fragments.

In a method step carried out simultaneously or subsequently, the contaminants 19 transformed into the gas phase are removed from the measurement chamber 7 wherein the pump device 18 is activated and the contaminants 19 are sucked away. After the completion of the cleaning process, the further valve 5a is closed and the operating pressure is reestablished in the measurement chamber 7. Once the operating pressure has been reached, the mass spectrometer 21 can again be used for carrying out a mass spectrometric examination of a gas mixture present in the process chamber 1.

It is understood that the structure 27 (structured component) of the measurement chamber 7 depicted in FIG. 2 shows a location of a possible deposition of the contaminants 19 in merely an exemplary manner, and that the structure 27 can vary in terms of its form. If the structure 27 is a filament, the latter can be switched off during the cleaning, but it is optionally also possible for the filament to be activated additionally for transforming the contaminants 19 into the gas phase. The structure 27 can also be a further ionization device, which is not embodied as a filament, but, for example, is embodied as a field ionization device or which structure serves for ionization via a pulsed laser. It is likewise understood that the embodiment of the plasma ionization device 9 can deviate from the configuration shown in FIG. 2 in order to bring the plasma 20 into the region of the contaminants 19 deposited on the inner structure 27.

Figure 3:
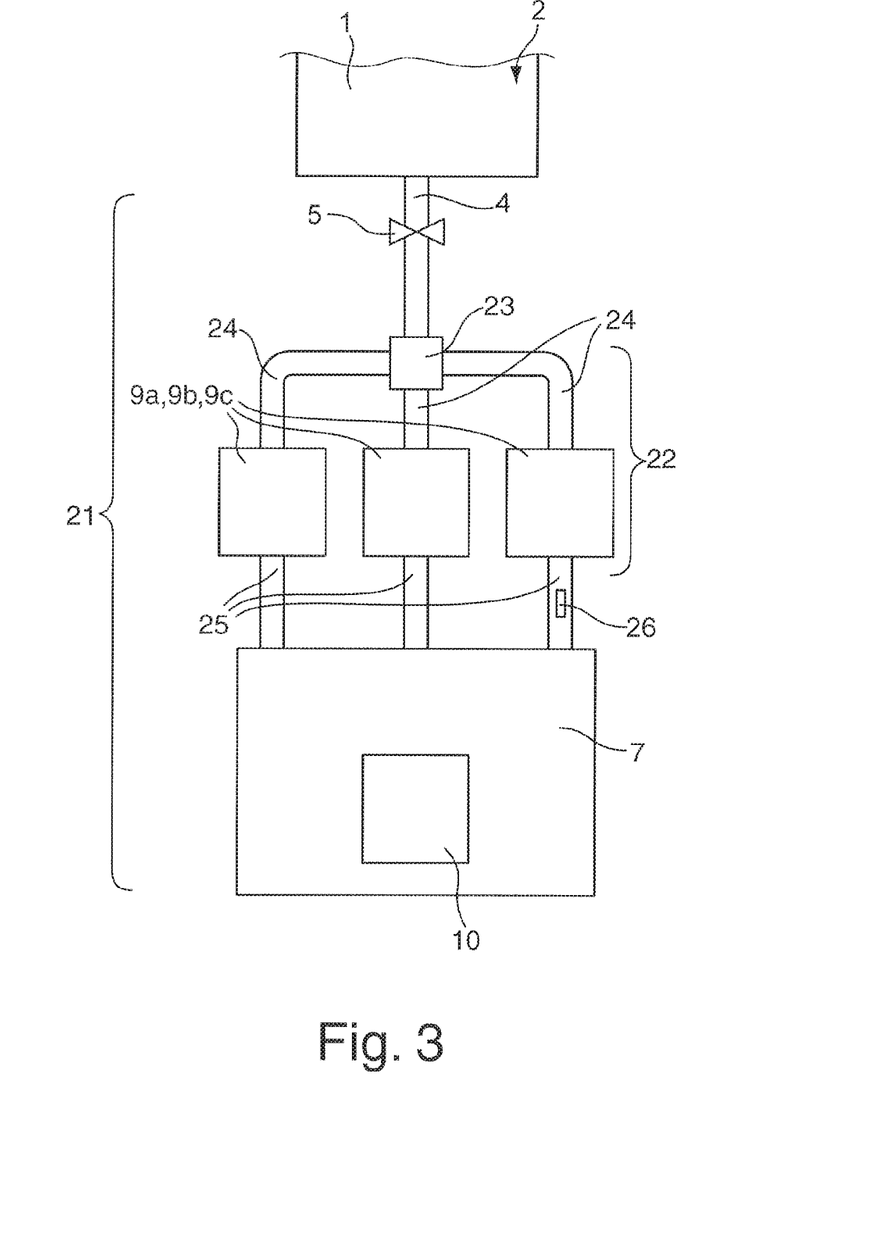
FIG. 3 shows a schematic representation of a mass spectrometer with an ionization unit, which comprises several ionization devices.

FIG. 3 depicts a mass spectrometer 21 with an ionization unit 22, which comprises a first, second and third ionization device 9a, 9b, 9c and also a selection device 23. The mass spectrometer 21 serves for mass spectrometric examination of the gas mixture 2, which comprises gaseous substances 3a and particles 3b contained in a residual gas. The gas mixture 2 is ionized by the ionization unit 22, more precisely by the first to third ionization devices 9a to 9c, and detected or evaluated via a detector embodied as ion trap or as quadrupole 10.

The mass spectrometer 21 is connected to a process chamber 1 in FIG. 3, in which process chamber the gas mixture 2 to be examined can initially be stored. The process chamber 1 is connected to the selection device 23 via an outlet 4 and a valve 5. The selection device 23 is or can be connected respectively to one of the first to third ionization devices 9a to 9c by pipes 24. Proceeding from the individual ionization devices 9a to 9c, further pipe connections 25 are provided, which open into a measurement chamber 7, in which the ion trap or a conventional (quadrupole) detector 10 (with analyzer) is arranged for detecting the ionized gas mixtures 2.

In FIG. 3, the first ionization device 9a is embodied as a plasma ionization device, the second ionization device 9b is embodied as e.g. a filament ionization device and the third ionization device 9c is embodied as a field ionization device, wherein the individual ionization devices 9a, 9b, 9c are arranged or connected parallel to one another. As a result, the gas mixture 2 introduced into the first to third ionization devices 9a to 9c can be ionized in each case via different ionization procedures. Alternatively, the ionization devices 9a, 9b, 9c can also be arranged in series or spatially in succession such that the gas mixture 2 to be examined passes through all ionization devices 9a, 9b, 9c prior to reaching the measurement chamber 7. It is understood that mixed forms between serial and parallel arrangement of the three ionization devices 9a, 9b, 9c are also possible.

The individual ionization devices 9a, 9b, 9c can alternatively be activated individually or together by the selection device 23 (e.g. in the form of a switchable valve) of the ionization unit 22. A common activation of ionization devices 9a to 9c should also be understood to mean the case where only two of the ionization devices 9a to 9c are activated at a given time. It is understood that the selection device 23, via which the feed of substances 2 to be detected to the ionization devices 9a to 9c is controlled or regulated, can also individually activate or switch off the ionization devices 9a to 9c themselves. By way of example, the filament of the filament ionization device 9b can optionally be heated or the heating of the filament can be deactivated, dependent on whether or not the gas mixture 2 to be examined is fed to the filament ionization device 9b. The selection device 23 can be operated manually by an operator or optionally with the aid of a control device (not shown here). Optionally, the selection device 23 can also be switched, e.g. via a control unit, depending on the result of the detection of the gas mixture 2, e.g. if the amount of a detected ionized substance per time unit is too low.

In order to use the mass spectrometer 21, the gas mixture 2 to be examined is initially introduced into the process chamber 1 or the gas mixture 2 has already accumulated in the process chamber. By opening the valve 5, the gas mixture 2 to be examined is fed to the selection device 23, which optionally can be supported by a pump device (not shown here) or a feed device in the form of a fan or the like.

The selection device 23 can make the fed gas mixture 2 available to either only one of the three plasma ionization devices 9a to 9c (e.g. only the first ionization device 9a embodied as plasma ionization device) or to several ionization devices 9a to 9c (in this case two or three). It is possible in an advantageous fashion to examine by mass spectroscopy a gas mixture 2 which is still unknown in terms of its chemical structure as a result of the option of individually activating the ionization devices 9a to 9c or adding these during the examination. The ion trap 10 arranged in the measurement chamber 7 can be an ion trap 10 described in conjunction with FIGS. 1 and 2, preferably an electric FT-ICR trap.

In order to simplify feeding of the ionized gas mixture 2 into the measurement chamber 7, provision can also be made for example for transport devices 26, which can be e.g. ion optical units, in the pipe connections 25 between the individual ionization devices 9a to 9c and the measurement chamber 7.

The advantages of the respective ionization procedures, which emerge from the use of the appropriate ionization devices 9a to 9c, can be combined in an advantageous manner and be used for the individually adapted mass spectrometric examination, using the mass spectrometer 21 shown in FIG. 3.

The self-cleaning illustrated above in conjunction with FIG. 2 can also take place in the mass spectrometer 21 depicted in FIG. 3, to be precise by virtue of the plasma ionization device 9a being employed for generating a plasma which is fed to the measurement chamber 7 for cleaning purposes. Via the pipe connections 24 or by optional further direct pipe connections (not shown here), the plasma produced in the plasma ionization device 9a can be fed to the other two ionization devices 9b, 9c in order to clean these. It is understood that, for this purpose, a plasma gas from a storage container can be fed to the plasma ionization device 9a (cf. FIG. 2). By way of example, the plasma gas can be an inert gas, e.g. argon or helium, or else a reactive gas, e.g. hydrogen or oxygen. The contaminants transformed into the gas phase can reach the measurement chamber 7 via the pipe connections 25 and can be discharged from there.

Figure 4:
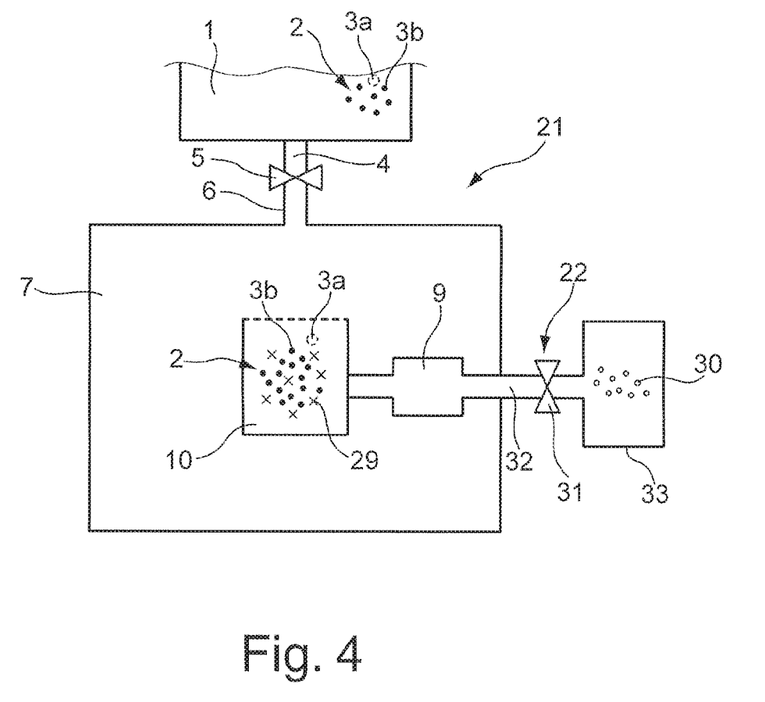
FIG. 4 shows a schematic representation of a mass spectrometer with an ionization unit, which comprises an ionization device for carrying out a charge exchange ionization of the gas mixture directly in the detector.

FIG. 4 shows a mass spectrometer 21, which has a similar configuration to the mass spectrometer 21 shown in FIG. 1. The mass spectrometer 21 serves for mass spectrometric examination of the gas mixture 2, which comprises gaseous substances 3a and particles 3b contained in a residual gas. The mass spectrometer 21 has an ionization unit 22 with a plasma ionization device 9, which enables charge exchange ionization directly in the detector 10. In the present example, the detector 10 is embodied as ion trap, in particular as FT-ICR trap or as orbitrap. However, a conventional measuring cell or a conventional mass spectrometer can also serve as detector 10; the conventional mass spectrometer having a photomultiplier, a secondary electron multiplier or the like for detection purposes and typically additionally house an analyzer for mass selection, i.e. the detector 10 corresponds to a conventional (quadrupole) mass spectrometer in which both analysis and detection are performed.

In the mass spectrometer 21 shown in FIG. 4, the gas mixture 2 is introduced directly, i.e. without prior ionization, into the detector 10 (i.e. into the measuring cell/ion trap). Ions and/or metastable or excited particles 29, produced by the plasma ionization device 9, are fed to the detector 10 in order to enable a charge exchange with the gas mixture 2 or an impact ionization. In order to produce the ions 29 via the plasma ionization device 9, a (neutral) ionization gas 30 is taken from a gas reservoir 33 via a metering valve 31 and a gas feed 32 and fed to the plasma ionization device 9.

The ionization gas 30 is ionized or excited in the plasma ionization device 9 and the ions or metastable/excited particles 29 produced herein are fed to the detector 10, in which the charge exchange ionization or impact ionization of the gas mixture 2 takes place. In this manner, the gas mixture 2 to be analyzed can be ionized, accumulated and measured directly in the measuring cell (detector 10), without transport of the ionized gas mixture into the detector 10 being required.

A large number of gasses and gas mixtures can be used as ionization gas 30, e.g. He, $H_2$, Ar, $N_2$, Xe, Kr, $CH_4$ etc. A plasma source, which may be configured as high frequency plasma source, medium frequency plasma source, direct current plasma source, dielectric barrier discharge plasma source, atmospheric pressure plasma source, corona discharge plasma source or the like, can serve as plasma ionization device 9. It is understood that another ionization device, which can produce an impact or charge exchange ionization of the gas mixture 2 in the detector 10, can also be used in place of a plasma source.

The invention claimed is:

1. A method, comprising:
    a) external to a three dimensional ion trap configured to store ions, producing ions and/or metastable particles;
    b) after a), in the three dimensional ion trap, interacting a gas mixture with the ions and/or the metastable particles to produce an ionized gas mixture; and
    c) after b), using the three dimensional ion trap to mass spectrometrically examine the ionized gas mixture,
    wherein a) comprises exposing an ionization gas to an ionizer to produce the ions and/or metastable particles.

2. The method of claim 1, wherein the ionizer comprises a member selected from the group consisting of a charge exchange ionizer, an electron impact ionizer, a filament ionizer, a field ionizer, a pulsed laser ionizer, a photon ionizer, a UV light ionizer, a VUV light ionizer and an EUV light ionizer.

3. The method of claim 1, wherein the ionizer comprises a plasma ionization device.

4. The method of claim 3, wherein:
the plasma ionization device uses a dielectric barrier to produce a plasma; and
the method comprises exposing the ionization gas to the plasma to produce the ions and/or metastable particles.

5. The method of claim 3, wherein:
the plasma ionization device uses a dielectric barrier to produce a radiofrequency plasma; and
the method comprises exposing the ionization gas to the radiofrequency plasma to produce the ions and/or metastable particles.

6. The method of claim 3, wherein:
the plasma ionization device uses a dielectric barrier to produce a direct current plasma; and
the method comprises exposing the ionization gas to the direct current plasma to produce the ions and/or metastable particles.

7. The method of claim 3, further comprising setting an ionization energy of the ionizer based on the gas mixture.

8. The method of claim 7, further comprising, prior to producing the ionized gas mixture, using the ionizer to produce a plasma to clean at least one member selected from the group consisting of the three dimensional ion trap, a measurement chamber, and the ionizer.

9. The method of claim 7, further comprising, prior to ionizing the gas mixture, using the ionizer to produce a plasma to clean a measurement chamber at a pressure of between one bar and $1 \times 10^{-10}$ millibar.

10. The method of claim 1, wherein the gas mixture comprises particles having an atomic mass number of between 100 and 20,000.

11. The method of claim 1, wherein the gas mixture comprises particles having an atomic mass number between 20,000 and 2,000,000.

12. The method of claim 1, wherein the gas mixture comprises ions.

13. The method of claim 1, wherein a) comprises exposing an ionization gas to an ionizer to produce the ions.

14. The method of claim 13, wherein the ionizer comprises a plasma ionization device.

15. The method of claim 14, further comprising setting an ionization energy of the ionizer based on the gas mixture.

16. The method of claim 15, further comprising, prior to producing the ionized gas mixture, using the ionizer to produce a plasma to clean at least one member selected from the group consisting of the three dimensional ion trap, a measurement chamber, and the ionizer.

17. A mass spectrometer, comprising:
an ionizer configured to provide charged particles or a plasma;
a gas reservoir configured to store an ionization gas;
a gas feed configured to deliver the ionization gas from the gas reservoir to the ionizer; and
a three dimensional ion trap configured to store ions,
wherein the mass spectrometer is configured so that during use of the mass spectrometer:
external to the three dimensional ion trap, the ionization gas is delivered from the gas reservoir to the ionizer so that the ionization gas interacts with charged particles or is exposed to the plasma provided by the ionizer to produce a product comprising at least one member selected from the group consisting of ions of the ionization gas and metastable particles of the ionization gas;
the product is transferred from the ionizer to the three dimensional ion trap;
in the three dimensional ion trap, the product ionizes a gas mixture to provide an ionized gas mixture; and
the three dimensional ion trap mass spectrometrically examines the ionized gas mixture.

18. The mass spectrometer of claim 17, wherein the product comprises ions of the ionization gas.

19. The mass spectrometer of claim 18, wherein:
the ions of the ionization gas are transferred from the ionizer to the three dimensional ion trap;
in the three dimensional ion trap, the ions of the ionization gas ionize a gas mixture to provide an ionized gas mixture; and
the three dimensional ion trap mass spectrometrically examines the ionized gas mixture.

20. The mass spectrometer of claim 17, wherein:
the ionizer is configured to provide charged particles; and
external to the three dimensional ion trap, the ionization gas is delivered from the gas reservoir to the ionizer so that the ionization gas interacts with charged particles provided by the ionizer to produce a product comprising at least one member selected from the group consisting of ions of the ionization gas and metastable particles of the ionization gas.

* * * * *